US012633881B2

(12) United States Patent
Chen et al.

(10) Patent No.: US 12,633,881 B2
(45) Date of Patent: May 19, 2026

(54) RADIO-FREQUENCY CIRCUIT AND BIAS CIRCUIT

(71) Applicant: RichWave Technology Corp., Taipei City (TW)

(72) Inventors: Chang-Heng Chen, Taipei City (TW); Tien-Yun Peng, Taipei City (TW); Chih-Sheng Chen, Taipei City (TW)

(73) Assignee: RichWave Technology Corp., Taipei City (TW)

( * ) Notice: Subject to any disclaimer, the term of this patent is extended or adjusted under 35 U.S.C. 154(b) by 430 days.

(21) Appl. No.: 18/202,963

(22) Filed: May 29, 2023

(65) Prior Publication Data
US 2024/0223133 A1     Jul. 4, 2024

(30) Foreign Application Priority Data

Dec. 29, 2022     (TW) ................................. 111150560

(51) Int. Cl.
H03F 1/30          (2006.01)
H03F 3/24          (2006.01)

(52) U.S. Cl.
CPC ............... H03F 1/30 (2013.01); H03F 3/245 (2013.01); H03F 2200/451 (2013.01)

(58) Field of Classification Search
None
See application file for complete search history.

(56) References Cited

U.S. PATENT DOCUMENTS

| | | | |
|---|---|---|---|
| 7,522,001 B2 * | 4/2009 | Yamamoto | H03F 1/302 |
| | | | 330/296 |
| 2018/0248523 A1 | 8/2018 | Rogers | |

OTHER PUBLICATIONS

Office action mailed on Nov.1, 2023 for the Taiwan application No. 111150560, filing date Dec. 29, 2022, pp. 1-6. , Nov. 1, 2023.

* cited by examiner

*Primary Examiner* — Andrea Lindgren Baltzell
*Assistant Examiner* — Malane Lieng
(74) *Attorney, Agent, or Firm* — Winston Hsu

(57)     ABSTRACT

A radio-frequency circuit can include a power amplifier, a first bias circuit and a second bias circuit. The power amplifier can include an input terminal used to receive a radio-frequency signal, and an output terminal used to output an amplified radio-frequency signal. The first bias circuit can include a first output terminal coupled to the input terminal of the power amplifier through a common node. The second bias circuit can include a second output terminal and a current adjustment circuit, where the second output terminal can be coupled to the common node, and the current adjustment circuit can include a transistor. The transistor can include a first terminal coupled to the second output terminal, a second terminal used to receive a reference voltage, and a control terminal.

16 Claims, 3 Drawing Sheets

RADIO-FREQUENCY CIRCUIT AND BIAS CIRCUIT

TECHNICAL FIELD

The disclosure is related to a radio-frequency circuit and a bias circuit, and more particularly, a radio-frequency circuit and a bias circuit capable of adjusting a current to reduce the current variation.

BACKGROUND

When supplying a current to a power amplifier, the current flowing into the power amplifier is often inaccurate due to the process variation of the transistors in the bias circuit. For example, according to measurement, the variation of the current flowing to the power amplifier may be as high as 20%.

As a result, accuracy and performance of the power amplifier are often poor. If the power amplifier is used in a radio-frequency circuit, the accuracy of the processed signal will be insufficient, and even errors will occur. Therefore, a solution is still in need to deal with the abovementioned problem.

SUMMARY

An embodiment provides a radio-frequency circuit including a power amplifier, a first bias circuit and a second bias circuit. The power amplifier can include an input terminal used to receive a radio-frequency signal, and an output terminal used to output an amplified radio-frequency signal. The first bias circuit can include a first output terminal coupled to the input terminal of the power amplifier through a common node. The second bias circuit can include a second output terminal and a current adjustment circuit, where the second output terminal can be coupled to the common node, and the current adjustment circuit can include a transistor. The transistor can include a first terminal coupled to the second output terminal, a second terminal used to receive a reference voltage, and a control terminal.

Another embodiment provides a bias circuit including an output terminal and a current adjustment circuit. The output terminal can be coupled to a power amplifier. The current adjustment circuit can be coupled to the output terminal and include a transistor. The transistor can include a first terminal coupled to the output terminal, a second terminal used to receive a reference voltage, and a control terminal coupled to a receiving terminal.

DETAILED DESCRIPTION

Figure 1:
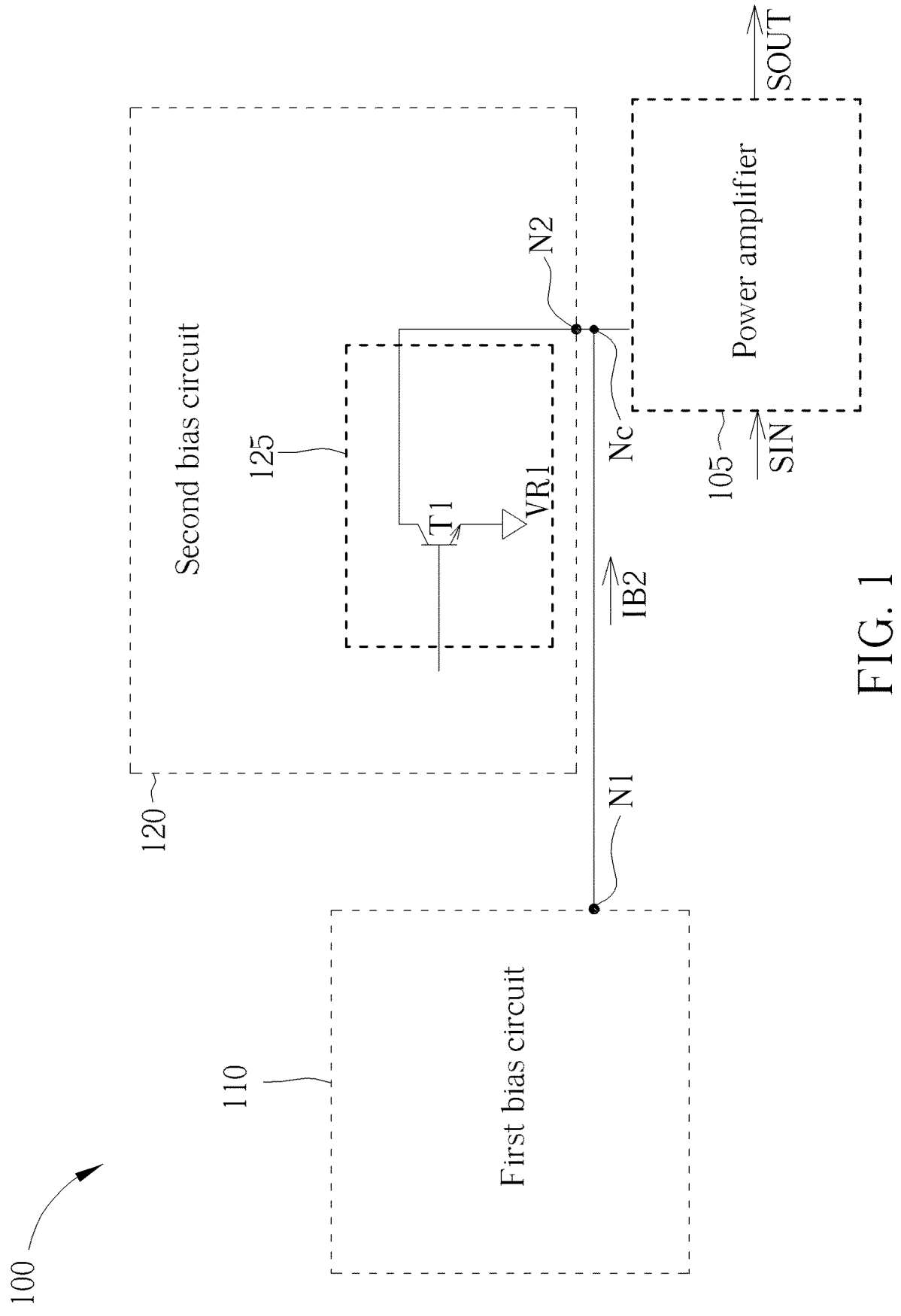
FIG. 1 illustrates a radio-frequency circuit according to an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

In the text, when it is mentioned that an element A is coupled to an element B, it means that the element A can be directly coupled to the element B, or the element A can be indirectly coupled to the element B through another element. In the text, each transistor can include a first terminal, a second terminal and a control terminal. In the text, each capacitor can include a first terminal and a second terminal, and each resistor can include a first terminal and a second terminal.

FIG. 1 illustrates a radio-frequency circuit 100 according to an embodiment. The radio-frequency circuit 100 can include a power amplifier 105, a first bias circuit 110 and a second bias circuit 120. The power amplifier 105 can include an input terminal and an output terminal, where the input terminal can be used to receive a radio-frequency signal SIN, and the output terminal can be used to output an amplified radio-frequency signal SOUT. The first bias circuit 110 can include a first output terminal N1. The first output terminal N1 can be coupled to the input terminal of the power amplifier 105 through a common node Nc. The second bias circuit 120 can include a second output terminal N2 and a current adjustment circuit 125. The second output terminal N2 can be coupled to the common node Nc. The current adjustment circuit 125 can include a transistor T1. The transistor T1 can include a first terminal, a second terminal and a control terminal. The first terminal of the transistor T1 can be coupled to the second output terminal N2, and the second terminal of the transistor T1 can be coupled to a reference voltage terminal to receive a reference voltage VR1.

Figure 2:
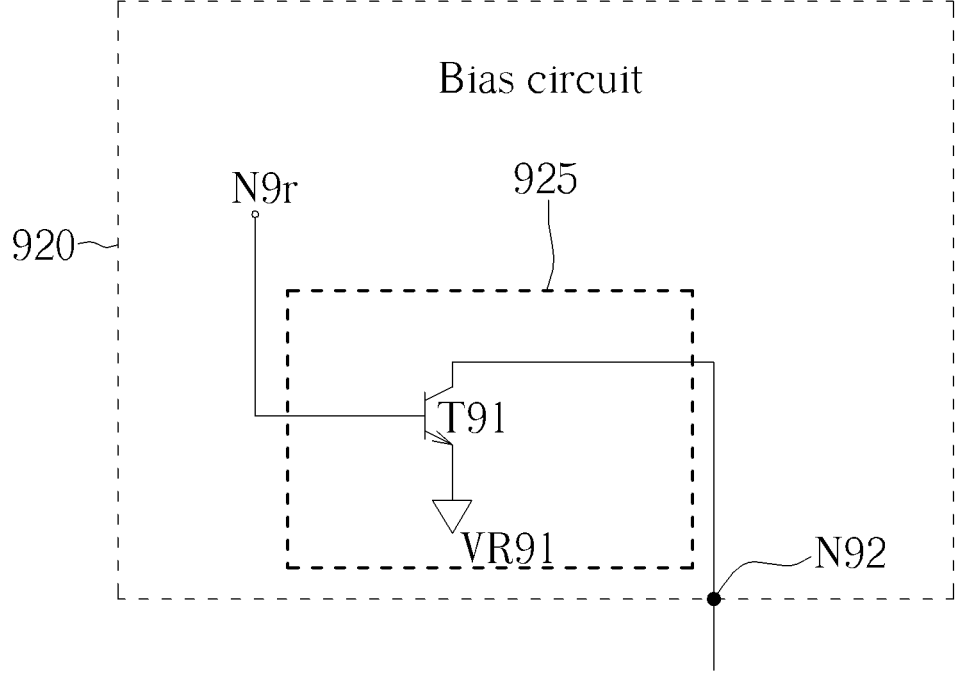
FIG. 2 illustrates a bias circuit according to an embodiment.

FIG. 2 illustrates a bias circuit 920 according to an embodiment. The bias circuit 920 can include an output terminal N92 and a current adjustment circuit 925. The output terminal N92 can be coupled to a power amplifier. The current adjustment circuit 925 can be coupled to the output terminal N92 and include a transistor T91. The transistor T91 can include a first terminal, a second terminal and a control terminal. The first terminal of the transistor T91 can be coupled to the output terminal N92, the second terminal of the transistor T91 can be coupled to a reference voltage terminal to receive a reference voltage VR91, and the control terminal of the transistor T91 can be coupled to a receiving terminal N9r.

Figure 3:
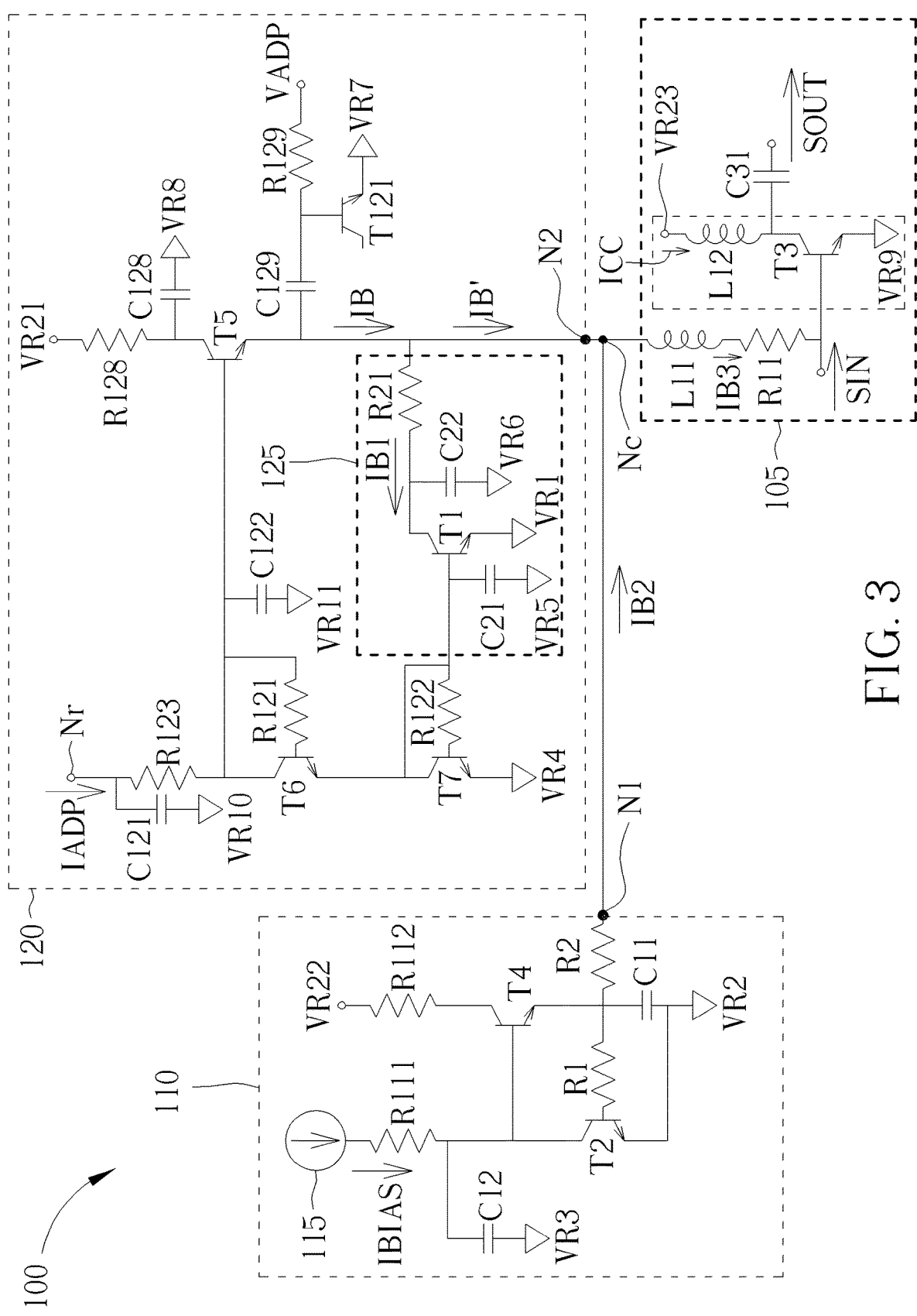
FIG. 3 illustrates the radio-frequency circuit according to an embodiment.

The bias circuit 920 and the current adjustment circuit 925 can be corresponding to the second bias circuit 120 and the current adjustment circuit 125 in FIG. 1 and FIG. 3 respectively. The receiving terminal N9r, the transistor T91, the reference voltage VR91 and the output terminal N92 in FIG. 2 can be corresponding to a receiving terminal Nr, the transistor T1, the reference voltage VR1 and the second output terminal N2 in FIG. 3 respectively.

FIG. 3 illustrates the radio-frequency circuit 100 according to an embodiment. The radio-frequency circuit 100 can include the power amplifier 105, the first bias circuit 110 and the second bias circuit 120. The power amplifier 105 can include an input terminal and an output terminal. The input terminal of the power amplifier 105 can be used to receive the radio-frequency signal SIN, and the output terminal of the power amplifier 105 can be used to output the amplified radio-frequency signal SOUT.

The first bias circuit 110 can include a first output terminal N1. The first output terminal N1 of the first bias circuit 110 can be coupled to the input terminal of the power amplifier 105 through the common node Nc. In FIG. 3, the common node Nc can be coupled to the input terminal of the power amplifier 105 through an inductor L11 and a resistor R11, where the inductor L11 and the resistor R11 can be selectively used. The inductor L11 and the resistor R11 can be replaced with other suitable passive components. The second bias circuit 120 can include a second output terminal N2, and the second output terminal N2 of the second bias circuit 120 can be coupled to the common node Nc. The second bias circuit 120 can further include the current adjustment circuit 125, and the current adjustment circuit 125 can include the transistor T1. The transistor T1 can include a first terminal, a second terminal and a control terminal. The first terminal of the transistor T1 can be coupled to the second output terminal N2, and the second terminal of the transistor T1 can be coupled to the reference voltage terminal to receive a reference voltage VR1.

The first bias circuit 110 can further include a transistor T2, a resistor R1 and a resistor R2. The transistor T2 can include a first terminal, a second terminal and a control terminal. The second terminal of the transistor T2 can be coupled to a reference voltage terminal to receive a reference voltage VR2. The resistor R1 can include a first terminal and a second terminal. The first terminal of the resistor R1 can be coupled to the control terminal of the transistor T2. The resistor R2 can include a first terminal and a second terminal. The first terminal of the resistor R2 can be coupled to the second terminal of the resistor R1. The second terminal of the resistor R2 can be coupled to the first output terminal N1 and be coupled to the common node Nc through the first output terminal N1.

The power amplifier 105 can further include a transistor T3. The transistor T3 can include a first terminal, a second terminal and a control terminal. The control terminal of the transistor T3 can be coupled to the first output terminal N1 through the resistor R11 and the inductor L11. The first terminal of the transistor T3 can be coupled to a reference voltage terminal through an inductor L12 to receive a reference voltage VR23. The second terminal of the transistor T3 can be coupled to a reference voltage terminal to receive a reference voltage VR9.

The first bias circuit 110 can further include a current source 115 and a transistor T4. The current source 115 can be coupled to the first terminal of the transistor T2 through the resistor R111, and the current source 115 can be used to provide a bias current IBIAS. The transistor T4 can include a first terminal, a second terminal and a control terminal. The first terminal of the transistor T4 can be coupled to a reference voltage terminal through a resistor R112 to receive a reference voltage VR22. The second terminal of the transistor T4 can be coupled to the second terminal of the resistor R1. The control terminal of the transistor T4 can be coupled to the first terminal of the transistor T2.

The first bias circuit 110 can further include a capacitor C11. The capacitor C11 can include a first terminal and a second terminal. The first terminal of the capacitor C11 can be coupled to the second terminal of the resistor R1. The second terminal of the capacitor C11 can be coupled to a reference voltage terminal to receive the reference voltage VR2.

The first bias circuit 110 can further include a capacitor C12. The capacitor C12 can include a first terminal and a second terminal. The first terminal of the capacitor C12 can be coupled to the first terminal of the transistor T2. The second terminal of the capacitor C12 can be coupled to a reference voltage terminal to receive a reference voltage VR3.

The current adjustment circuit 125 can be used to reduce a current IB' to be smaller than a predetermined current value, and the current IB' can be provided by the second bias circuit 120 to the power amplifier 105. For example, the predetermined current value can be between 80% and 120% of 50 microamperes ($\mu$A). For example, the predetermined current value can be 60 $\mu$A. Ideally, the current adjustment circuit 125 can be used to reduce the current IB' provided by the second bias circuit 120 to the power amplifier 105 to substantially zero amperes. However, it is difficult to reduce the current IB' to zero amperes. Hence, according to embodiments, the current IB' can be smaller than 100 $\mu$A or 60 $\mu$A. Preferably, the current IB' can be smaller than 40 $\mu$A. The current IB' can be a difference between the current IB and the current IB1, and it can be expressed as IB'=IB−IB1.

The current adjustment circuit 125 can be used to allow the second bias circuit 120 to provide the current IB' to the power amplifier 105. The first bias circuit 110 can be used to allow the power amplifier 105 to generate a current ICC. A ratio of the current IB' to the current IB2 can be smaller than 10%, and it can be expressed as IB'/IB2<10%. According to embodiments, the ratio of the current IB' to the current IB2 can be 6% approximately, and it can be expressed as IB'/IB2≈6%.

For example, the currents IB, IB1, IB2 and IB3 can be as described in Table 1.

TABLE 1

| Current | IB | IB1 | IB2 | IB3 |
|---|---|---|---|---|
| current value | 795 $\mu$A | 744 $\mu$A | 748 $\mu$A | 799 $\mu$A |
| ratio to IB1 | 1.069 | 1 | 1.005 | 1.073 |

The control terminal of the transistor T1 can be coupled to the receiving terminal Nr. The receiving terminal Nr can be used to receive an operation current IADP. The operation current IADP can be used to control the conductivity of the transistor T1.

The second bias circuit 120 can further include a transistor T5. The transistor T5 can include a first terminal, a second terminal and a control terminal. The first terminal of the transistor T5 can be coupled to a reference voltage terminal to receive a reference voltage VR21. The second terminal of the transistor T5 can be coupled to the common node Nc and the first terminal of the transistor T1. The control terminal of the transistor T5 can be coupled to the receiving terminal Nr.

The second bias circuit 120 can further include a resistor R128, a capacitor C128, a capacitor C129, a resistor R129 and a transistor T121 for adjusting AM-AM (Amplitude Modulation-Amplitude Modulation) characteristics and AM-PM (Amplitude Modulation-Phase Modulation) characteristics of the amplifier. The first terminal of the transistor T5 can be coupled to a reference voltage terminal providing a reference voltage VR8 through the capacitor C128. A first terminal of the capacitor C129 can be coupled to the second terminal of the transistor T5. A second terminal of the capacitor C129 can be coupled to a first terminal of the resistor R129. A second terminal of the resistor R129 can be used to receive an operation voltage VADP. A control terminal of the transistor T121 can be coupled to the second terminal of the capacitor C129. A first terminal of the transistor T121 can be floating. A second terminal of the transistor T121 can be coupled to a reference voltage terminal to receive a reference voltage VR7.

The second bias circuit 120 can further include a transistor T6 and a transistor T7. The transistor T6 can include a first terminal, a second terminal and a control terminal. The first terminal of the transistor T6 can be coupled to the receiving terminal Nr. The control terminal of the transistor T6 can be coupled to the first terminal of the transistor T6. The transistor T7 can include a first terminal, a second terminal and a control terminal. The first terminal of the transistor T7 can be coupled to the second terminal of the transistor T6. The second terminal of the transistor T7 can be coupled to a reference voltage terminal to receive a reference voltage VR4. The control terminal of the transistor T7 can be coupled to the first terminal of the transistor T7.

The second bias circuit 120 can further include resistors R121, R122 and R123 and capacitors C121 and C122. The first terminal of the transistor T6 can be coupled to the receiving terminal Nr through the resistor R123. The control terminal of the transistor T6 can be coupled to the first terminal of the transistor T6 through the resistor R121. The control terminal of the transistor T7 can be coupled to the first terminal of the transistor T7 through the resistor R122. A first terminal of the capacitor C121 can be coupled to the receiving terminal Nr. A second terminal of the capacitor C121 can be coupled to a reference voltage terminal to receive a reference voltage VR10. A first terminal of the capacitor C122 can be coupled to the first terminal of the transistor T6. A second terminal of the capacitor C122 can be coupled to a reference voltage terminal to receive a reference voltage VR11.

The second bias circuit can further include a capacitor C21. The capacitor C21 can include a first terminal and a second terminal. The first terminal of the capacitor C21 can be coupled to the control terminal of the transistor T1. The second terminal of the capacitor C21 can be coupled to a reference voltage terminal to receive a reference voltage VR5.

The current adjustment circuit 125 can include a resistor R21. The resistor R21 can include a first terminal and a second terminal. The first terminal of the resistor R21 can be coupled to the first terminal of the transistor T1. The second terminal of the resistor R21 can be coupled to the second output terminal N2, the common node Nc and the second terminal of the transistor T5.

The current adjustment circuit 125 can further include a capacitor C22. The capacitor C22 can include a first terminal and a second terminal. The first terminal of the capacitor C22 can be coupled to the first terminal of the transistor T1. The second terminal of the capacitor C22 can be coupled to a reference voltage terminal to receive a reference voltage VR6.

In the radio-frequency circuit 100, the first bias circuit 110 can be used to provide a current (e.g. IB'), and the second bias circuit 120 can be used to maintain the AM-AM characteristics and AM-PM characteristics of the amplifier. The current adjustment circuit 125 can draw a portion of the current provided by the second bias circuit 120 for adjusting the current. If the current adjustment circuit 125 is not in use, the current provided by the first bias circuit 110 and the second bias circuit 120 will be excessive.

In the radio-frequency circuit 100, if the resistor R121, the resistor R122, the current adjustment circuit 125 and the first bias circuit 110 are not in use, a circuit formed with the transistors T6 and T7 of the second bias circuit 120 can still generate a current and provide the current to the power amplifier 105. However, with this circuit, the variation of the current provided to the power amplifier 105 is relatively large (e.g. the variation can be about 30%). If the resistors R121 and R122 are further used, and the first bias circuit 110 is not in use, the variation of the current provided to the power amplifier 105 can be reduced (e.g. the variation can be about 12%). In order to further reduce the variation of the current provided to the power amplifier 105, the first bias circuit 110 and the current adjustment circuit 125 can be further used. The first bias circuit 110 and the power amplifier 105 can form a current mirror structure to reduce the variation of the current provided to the power amplifier 105.

The current ICC in the power amplifier 105 can vary with a ratio of a size of the transistor T3 of the power amplifier 105 to a size of the transistor T2 of the first bias circuit 110. If the current adjustment circuit 125 is not in use, the sum of the current provided by the current mirror structure formed with the first bias circuit 110 and the power amplifier 105 the current provided by the second bias circuit 120 will be excessive. Hence, the current adjustment circuit 125 can be used to draw a current. Ideally, the current IB1 drawn by the current adjustment circuit 125 can be equal to the current IB, so the ideal current value of the current IB' can be 0. However, according to embodiments, the current IB' can still have a small current value. Through the structure of the radio-frequency circuit 100, the variation of the current ICC flowing through the power amplifier 105 can be reduced (e.g. the variation can be less than 3%). As a result, the accuracy and performance of the power amplifier 105 are improved.

The power amplifier 105 can include a capacitor C31. A first terminal of the capacitor C31 can be coupled to the first terminal of the transistor T3. A second terminal of the capacitor C31 can be coupled to the output terminal of power amplifier 105.

The abovementioned reference voltages V1, V2, V3, V4, V5, V6, V7, V8, V9, V10 and V11 can be different voltages or the same voltage. For example, each of the reference voltages V1, V2, V3, V4, V5, V6, V7, V8, V9, V10 and V11 can be a ground voltage or a predetermined low reference voltage. The abovementioned reference voltages V21, V22 and V23 can be different voltages or the same voltage. For example, each of the reference voltages V21, V22 and V23 can be a predetermined high reference voltage.

In summary, through the structure of the radio-frequency circuit 100, the current variation of the power amplifier 105 is effectively reduced, and the accuracy and performance of the power amplifier 105 are improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio-frequency circuit comprising:
 a power amplifier comprising an input terminal configured to receive a radio-frequency signal, and an output terminal configured to output an amplified radio-frequency signal;
 a first bias circuit comprising:
  a first output terminal coupled to the input terminal of the power amplifier through a common node;
  a second transistor comprising a first terminal, a second terminal configured to receive a second reference voltage, and a control terminal;
  a first resistor comprising a first terminal coupled to the control terminal of the second transistor, and a second terminal; and a second resistor comprising a first terminal coupled to the second terminal of the first resistor, and a second terminal coupled to the first output terminal; and a second bias circuit comprising:

a second output terminal coupled to the common node; and a current adjustment circuit comprising a first transistor, the first transistor comprising a first terminal coupled to the second output terminal, a second terminal configured to receive a first reference voltage, and a control terminal.

2. The radio-frequency circuit of claim 1, wherein the power amplifier further comprises:

a third transistor comprising a first terminal, a second terminal and a control terminal coupled to the first output terminal.

3. The radio-frequency circuit of claim 1, wherein the first bias circuit further comprises:

a current source coupled to the first terminal of the second transistor, and configured to provide a bias current; and a fourth transistor comprising a first terminal configured to receive a third reference voltage, a second terminal coupled to the second terminal of the first resistor, and a control terminal.

4. The radio-frequency circuit of claim 3, wherein the control terminal of the fourth transistor is coupled to the first terminal of the second transistor.

5. The radio-frequency circuit of claim 1, wherein the first bias circuit further comprises:

a capacitor comprising a first terminal coupled to the second terminal of the first transistor, and a second terminal configured to receive the second reference voltage.

6. The radio-frequency circuit of claim 1, wherein the current adjustment circuit is configured to reduce a current provided by the second bias circuit to the power amplifier to be smaller than 100 microamperes.

7. The radio-frequency circuit of claim 6, wherein the current adjustment circuit is configured to reduce the current provided by the second bias circuit to the power amplifier to be substantially zero amperes.

8. A radio-frequency circuit, comprising:

a power amplifier comprising an input terminal configured to receive a radio-frequency signal, and an output terminal configured to output an amplified radio-frequency signal;

a first bias circuit comprising a first output terminal coupled to the input terminal of the power amplifier through a common node; and a second bias circuit comprising:

a second output terminal coupled to the common node; and a current adjustment circuit comprising a first transistor, the first transistor comprising a first terminal coupled to the second output terminal, a second terminal configured to receive a first reference voltage, and a control terminal;

wherein:

the current adjustment circuit is configured to control the second bias circuit to provide a first current to the power amplifier;

the first bias circuit is configured to control the power amplifier to generate a second current; and a ratio of the first current to the second current is less than 10%.

9. The radio-frequency circuit of claim 1, wherein the control terminal of the first transistor is coupled to a receiving terminal, and the receiving terminal is configured to receive an operation current.

10. The radio-frequency circuit of claim 9, wherein the second bias circuit further comprises:

a fifth transistor comprising a first terminal configured to receive a second reference voltage, a second terminal coupled to the first terminal of the first transistor, and a control terminal coupled to the receiving terminal.

11. The radio-frequency circuit of claim 9, wherein the second bias circuit further comprises:

a sixth transistor comprising a first terminal coupled to the receiving terminal, a second terminal, and a control terminal coupled to the first terminal of the sixth transistor; and a seventh transistor comprising a first terminal coupled to the second terminal of the sixth transistor, a second terminal configured to receive a second reference voltage, and a control terminal coupled to the first terminal of the seventh transistor.

12. The radio-frequency circuit of claim 11, wherein the second bias circuit further comprises:

a capacitor comprising a first terminal coupled to the control terminal of the first transistor, and a second terminal configured to receive a third reference voltage.

13. The radio-frequency circuit of claim 1, wherein the current adjustment circuit further comprises:

a resistor comprising a first terminal coupled to the first terminal of the first transistor, and a second terminal coupled to the second output terminal.

14. The radio-frequency circuit of claim 13, wherein the current adjustment circuit further comprises:

a capacitor comprising a first terminal coupled to the first terminal of the first transistor, and a second terminal configured to receive a second reference voltage.

15. A bias circuit comprising:

an output terminal coupled to a power amplifier;

a current adjustment circuit coupled to the output terminal and comprising a first transistor, the first transistor comprising a first terminal coupled to the output terminal, a second terminal configured to receive a first reference voltage, and a control terminal coupled to a receiving terminal; and a second transistor comprising a first terminal configured to receive a second reference voltage, a second terminal coupled to the first terminal of the first transistor, and a control terminal coupled to the receiving terminal.

16. The bias circuit of claim 15, further comprising:

a third transistor comprising a first terminal coupled to the receiving terminal, a second terminal, and a control terminal coupled to the first terminal of the third transistor; and a fourth transistor comprising a first terminal coupled to the second terminal of the third transistor, a second terminal configured to receive a second reference voltage, and a control terminal coupled to the first terminal of the fourth transistor.

* * * * *